(12) United States Patent
Kim et al.

(10) Patent No.: US 10,047,930 B2
(45) Date of Patent: Aug. 14, 2018

(54) LIGHT EMITTING MODULE AND LENS

(71) Applicant: Seoul Semiconductor Co., Ltd., Ansan-si (KR)

(72) Inventors: Eun Ju Kim, Ansan-si (KR); Bang Hyun Kim, Ansan-si (KR); Young Eun Yang, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/585,791

(22) Filed: Dec. 30, 2014

(65) Prior Publication Data

US 2015/0117016 A1    Apr. 30, 2015

Related U.S. Application Data

(63) Continuation of application No. 14/362,393, filed as application No. PCT/KR2012/010314 on Nov. 30, 2012.

(30) Foreign Application Priority Data

Dec. 2, 2011  (KR) .................. 10-2011-0128375
Dec. 23, 2011 (KR) .................. 10-2011-0141098

(51) Int. Cl.
   *F21V 5/04*       (2006.01)
   *F21K 99/00*      (2016.01)
   (Continued)

(52) U.S. Cl.
   CPC .............. *F21V 5/045* (2013.01); *F21K 9/64* (2016.08); *F21V 5/002* (2013.01); *F21V 5/004* (2013.01);
   (Continued)

(58) Field of Classification Search
   CPC ... F21K 9/50; F21K 9/56; F21V 13/02; F21V 13/04; F21V 5/04; F21V 5/046;
   (Continued)

(56) References Cited

U.S. PATENT DOCUMENTS 1,751,070 A * 3/1930 Boots ................ B60Q 1/26
                                              313/116
4,264,948 A * 4/1981 Cherouge ............ F21V 5/04
                                              362/311.01
(Continued)

FOREIGN PATENT DOCUMENTS

CN    1763603    4/2006
CN    1854770    11/2006
(Continued)

OTHER PUBLICATIONS

International Search Report dated Mar. 8, 2013, issued in International Patent Application No. PCT/KR2012/010314.
(Continued)

*Primary Examiner* — Alexander Garlen
*Assistant Examiner* — Colin Catttanach
(74) *Attorney, Agent, or Firm* — H.C. Park & Associates, PLC

(57) ABSTRACT

A lens including an upper surface having a curved portion having a changing curvature in a direction extending away from a central axis of the lens, and a lower surface having a concave portion disposed on the central axis of the lens. The concave portion of the lower surface includes an entrance disposed on a lower region of the concave portion and configured to receive light emitted from a light-emitting diode chip, and an upper end surface disposed on an upper region of the concave portion. The concave portion includes a width that narrows in a direction extending away from the entrance. The upper end surface is nonplanar.

10 Claims, 12 Drawing Sheets

(51) Int. Cl.
*G02F 1/1335* (2006.01)
*F21K 9/64* (2016.01)
*H01L 33/58* (2010.01)
*H01L 23/31* (2006.01)
*G02B 3/02* (2006.01)
*G02B 3/04* (2006.01)
*F21V 5/00* (2018.01)

(52) U.S. Cl.
CPC ............... *F21V 5/048* (2013.01); *G02B 3/02* (2013.01); *G02B 3/04* (2013.01); *G02F 1/133611* (2013.01); *G02F 2001/133607* (2013.01); *H01L 23/31* (2013.01); *H01L 33/58* (2013.01); *H01L 2924/1815* (2013.01); *H01L 2924/1816* (2013.01)

(58) Field of Classification Search
CPC . F21V 5/048; G02B 19/0014; G02B 19/0028; G02B 19/0066; G02B 5/021; G02B 5/0268; G02B 3/02; G02B 3/04; G02B 3/06; G02B 3/08; H01L 33/58; H01L 2924/1815; H01L 2924/1816; H01L 23/31
USPC .................. 362/311.01, 311.02, 326–340
See application file for complete search history.

(56) References Cited

U.S. PATENT DOCUMENTS

| | | | | |
|---|---|---|---|---|
| 5,526,247 A * | 6/1996 | Sugiyama | ............ | B60Q 1/2607 362/268 |
| 6,536,923 B1 * | 3/2003 | Merz | ..................... | F21S 48/215 362/245 |
| 7,153,000 B2 * | 12/2006 | Park | ......................... | H01L 33/58 257/100 |
| 7,273,299 B2 | 9/2007 | Parkyn et al. | | |
| 7,422,347 B2 | 9/2008 | Miyairi et al. | | |
| 7,489,453 B2 | 2/2009 | Chinniah et al. | | |
| 7,674,019 B2 * | 3/2010 | Parkyn | ....................... | F21V 5/04 362/332 |
| 8,419,229 B2 * | 4/2013 | Dong | ....................... | F21V 5/04 362/296.01 |
| 8,662,713 B2 | 3/2014 | Kim | | |
| 8,967,833 B2 * | 3/2015 | Wang | ....................... | F21V 5/04 359/708 |
| 9,134,007 B2 * | 9/2015 | Wang | ....................... | F21V 5/043 |
| 9,217,854 B2 * | 12/2015 | Wilcox | .............. | G02B 17/0856 |
| 9,416,926 B2 * | 8/2016 | Wilcox | .............. | G02B 19/0014 |
| 2003/0103271 A1 * | 6/2003 | Ohta | ......................... | G02B 1/11 359/719 |
| 2004/0070855 A1 * | 4/2004 | Benitez | .............. | G02B 19/0061 359/858 |
| 2004/0125613 A1 * | 7/2004 | Hasegawa | ........... | F21S 48/1233 362/507 |
| 2006/0083000 A1 * | 4/2006 | Yoon | ......................... | F21V 5/04 362/311.02 |
| 2006/0238884 A1 * | 10/2006 | Jang | ......................... | F21V 5/04 359/653 |
| 2008/0043466 A1 | 2/2008 | Chakmakjian et al. | | |
| 2008/0100773 A1 * | 5/2008 | Hwang | .................. | G02B 3/005 349/62 |
| 2008/0151551 A1 * | 6/2008 | Yang | ......................... | F21V 5/046 362/308 |
| 2008/0310159 A1 * | 12/2008 | Chinniah | .............. | F21S 48/1154 362/244 |
| 2009/0116245 A1 * | 5/2009 | Yamaguchi | .............. | G02B 3/04 362/311.01 |
| 2009/0207586 A1 * | 8/2009 | Arai | ....................... | G02B 5/021 362/97.1 |
| 2009/0279311 A1 * | 11/2009 | Yu | ............................. | F21K 9/00 362/310 |
| 2010/0053973 A1 | 3/2010 | Shastry et al. | | |
| 2010/0165640 A1 | 7/2010 | Lin et al. | | |
| 2010/0226127 A1 * | 9/2010 | Bigliatti | .................... | F21V 5/00 362/235 |
| 2010/0271708 A1 * | 10/2010 | Wilcox | .............. | G02B 17/0856 359/654 |
| 2010/0302785 A1 * | 12/2010 | Zhou | ........................ | F21V 5/04 362/311.02 |
| 2011/0044053 A1 * | 2/2011 | Yamaguchi | ............ | G02B 7/023 362/296.05 |
| 2011/0051394 A1 * | 3/2011 | Bailey | ....................... | F21K 9/00 362/84 |
| 2011/0080745 A1 * | 4/2011 | Chen | ......................... | F21V 5/08 362/335 |
| 2011/0116272 A1 * | 5/2011 | Bak | .......................... | F21V 5/04 362/296.01 |
| 2011/0127903 A1 * | 6/2011 | Yao | ......................... | H01L 33/54 313/498 |
| 2011/0249451 A1 * | 10/2011 | Fujii | .................. | G02B 27/0955 362/317 |
| 2011/0255291 A1 * | 10/2011 | Seki | .................... | G02B 19/0061 362/297 |
| 2011/0273882 A1 * | 11/2011 | Pickard | ..................... | F21K 9/00 362/237 |
| 2012/0014115 A1 | 1/2012 | Park et al. | | |
| 2012/0057354 A1 * | 3/2012 | Lee | ........................... | G02B 3/08 362/311.09 |
| 2012/0113653 A1 | 5/2012 | Koizumi | | |
| 2012/0162783 A1 * | 6/2012 | Bemmerl | .................. | G02B 3/00 359/707 |
| 2012/0250331 A1 * | 10/2012 | De Lamberteire | .. | F21S 48/1154 362/311.1 |
| 2013/0077304 A1 | 3/2013 | Gordin et al. | | |
| 2013/0094218 A1 * | 4/2013 | Wang | ........................ | F21V 5/04 362/311.02 |
| 2013/0155690 A1 | 6/2013 | Chen et al. | | |
| 2014/0104853 A1 | 4/2014 | Lin et al. | | |
| 2014/0126222 A1 * | 5/2014 | Wang | ........................ | F21V 5/043 362/311.09 |
| 2014/0320781 A1 | 10/2014 | Park et al. | | |
| 2015/0029727 A1 * | 1/2015 | Ikeda | ........................ | F21V 5/00 362/311.01 |

FOREIGN PATENT DOCUMENTS

| | | |
|---|---|---|
| CN | 102074645 | 5/2011 |
| JP | 61-183005 | 11/1986 |
| JP | 10-82915 | 3/1998 |
| JP | 2007-140524 | 6/2007 |
| JP | 2007-227410 | 9/2007 |
| JP | 2009-044016 | 2/2009 |
| JP | 2009-192915 | 8/2009 |
| JP | 2011-014831 | 1/2011 |
| KR | 10-2006-0112071 | 10/2006 |
| KR | 10-2011-0055867 | 5/2011 |
| KR | 10-2011-0080708 | 7/2011 |
| WO | WO 2010/118718 A1 * | 10/2010 |

OTHER PUBLICATIONS

Written Opinion dated Mar. 8, 2013, issued in International Patent Application No. PCT/KR2012/010314.
Non-Final Office Action dated Oct. 15, 2015 issued in U.S. Appl. No. 14/362,393.
Non-Final Office Action dated Nov. 30, 2016, in U.S. Appl. No. 14/362,393.
Final Office Action dated Jun. 9, 2017, in U.S. Appl. No. 14/362,393.
The Korean Office Action dated Nov. 1, 2017, issued in Korean Patent Application No. 10-2011-0141098.
Non-Final Office Action dated Sep. 21, 2017 in U.S. Appl. No. 14/362,393.
Notice of Allowance dated Apr. 23, 2018 issued in U.S. Appl. No. 14/362,393.

* cited by examiner

[Fig. 1]
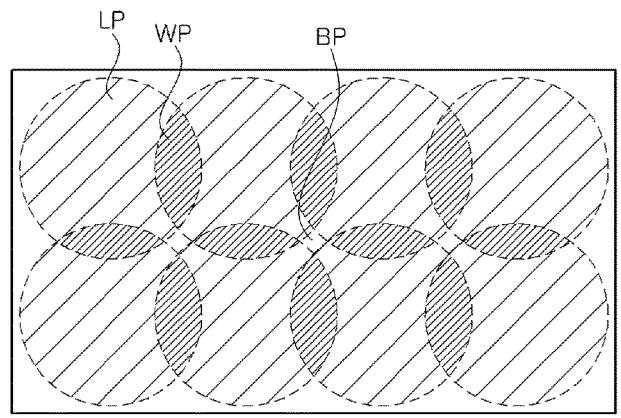
[Fig. 2]
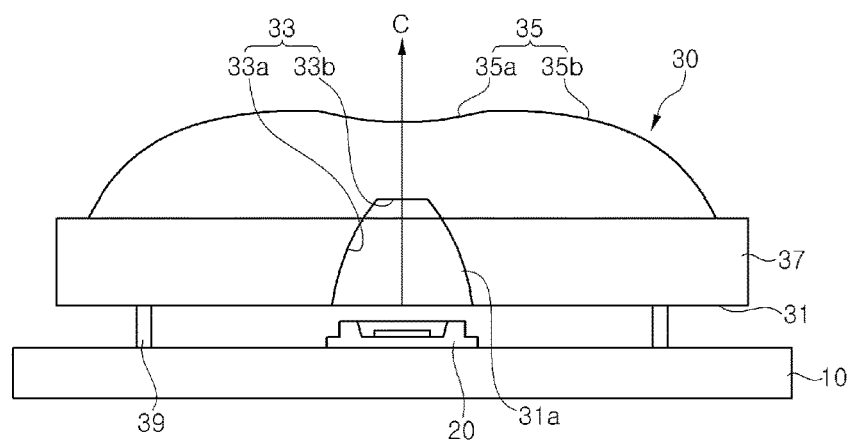
[Fig. 3]
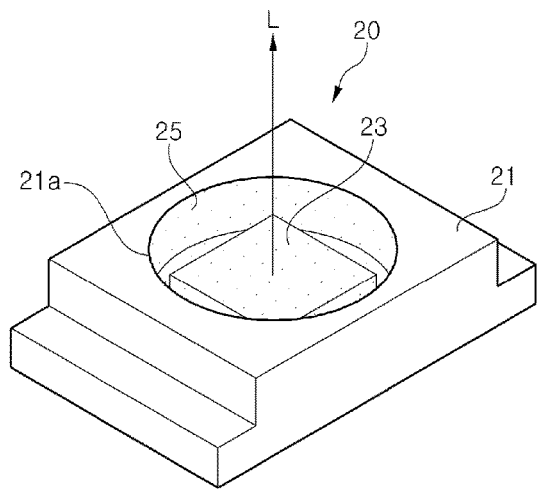

[Fig. 4 (a)]
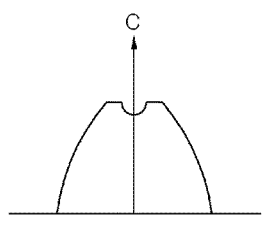
[Fig. 4 (b)]
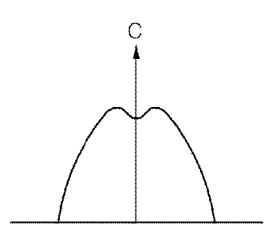
[Fig. 4 (c)]
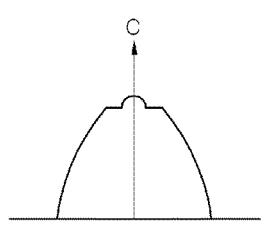
[Fig. 4 (d)]
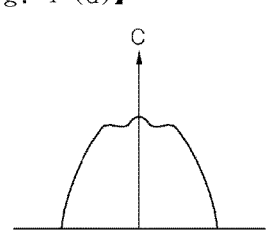

[Fig. 5 (a)]
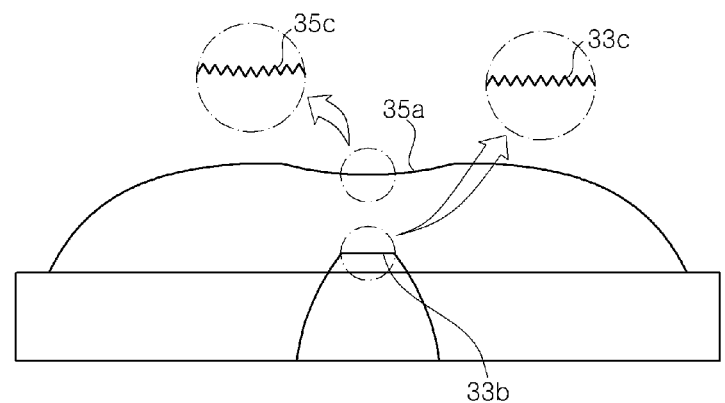
[Fig. 5 (b)]
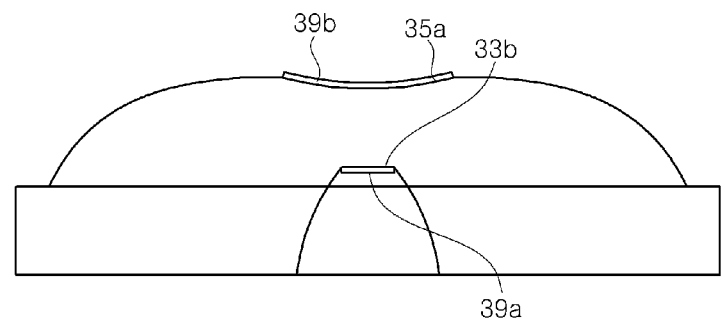

[Fig. 6]
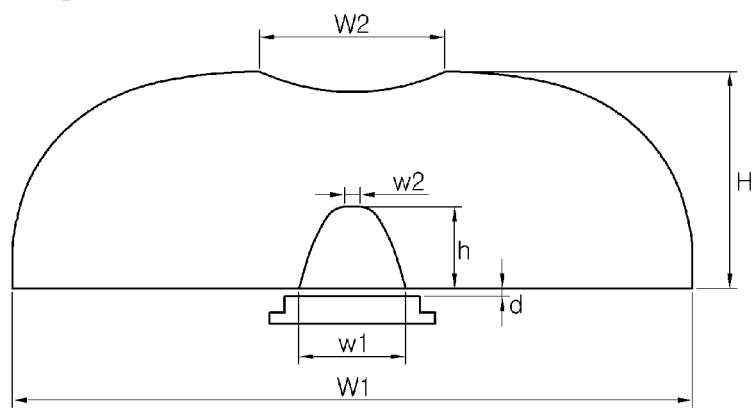

[Fig. 7 (a)]
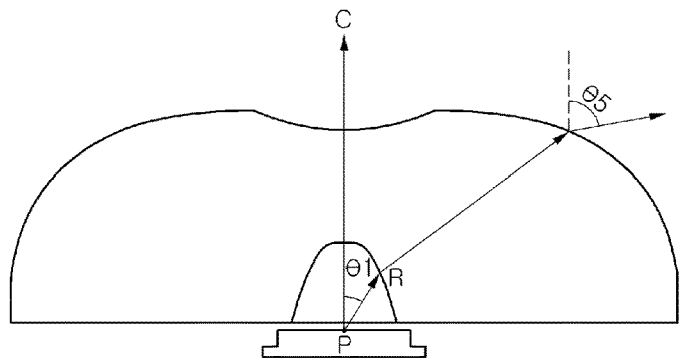
[Fig. 7 (b)]
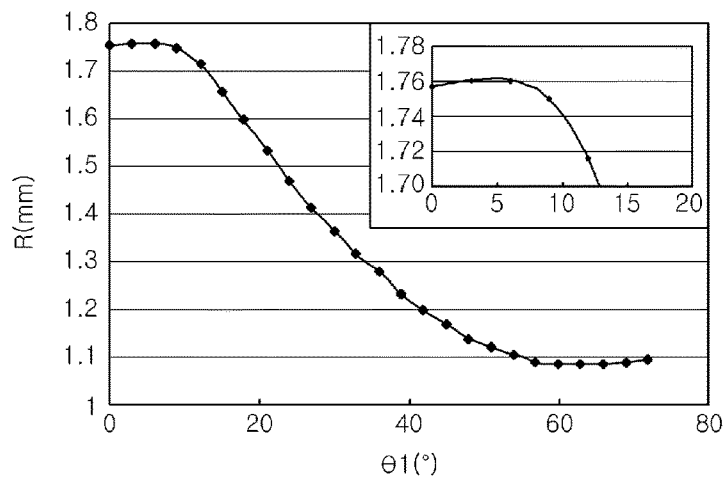
[Fig. 7 (c)]
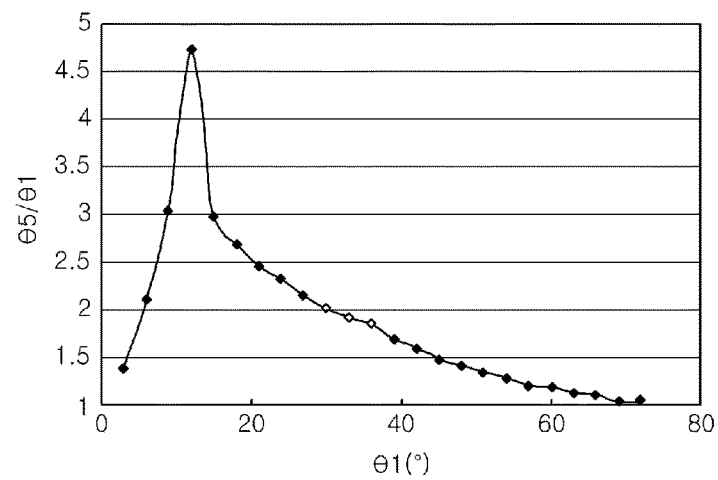

【Fig. 8】
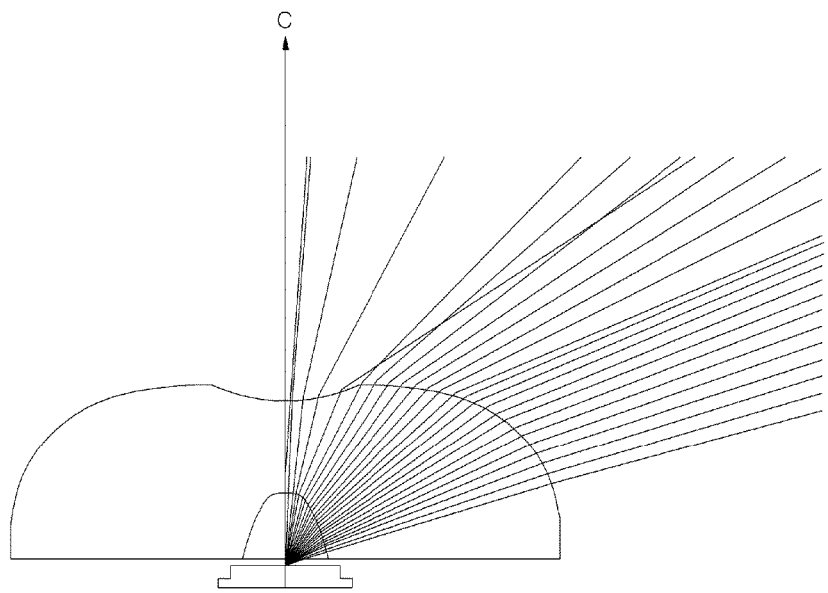
【Fig. 9 (a)】
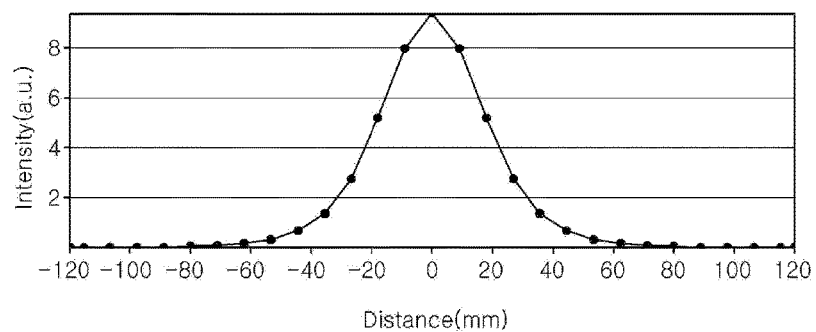
【Fig. 9 (b)】
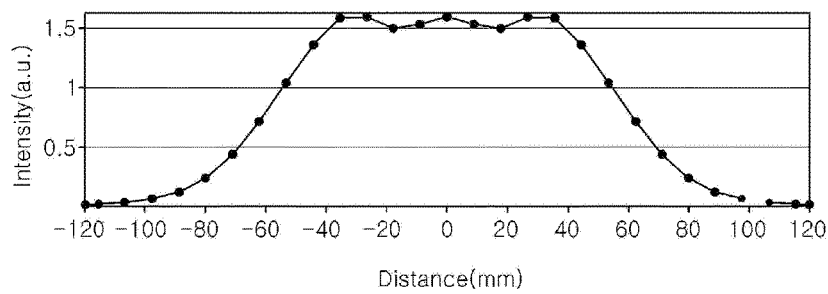

[Fig. 10 (a)]
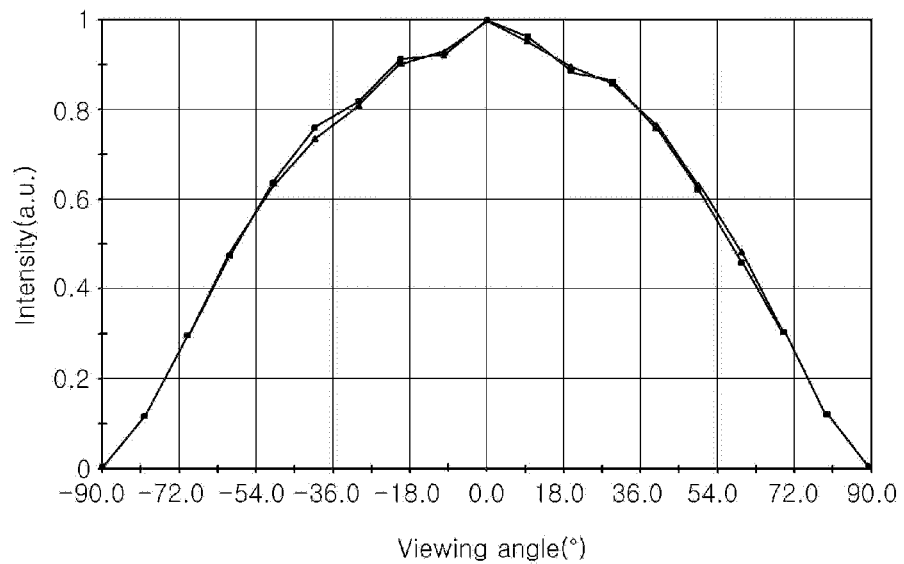
[Fig. 10 (b)]
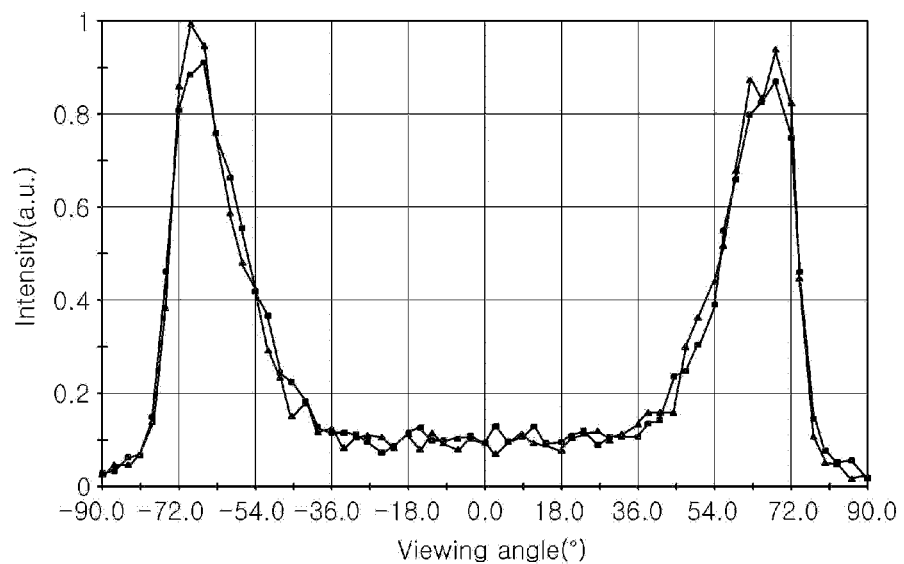

[Fig. 11]
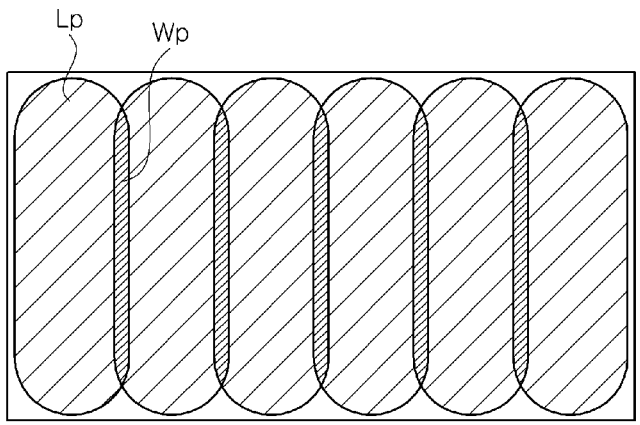
[Fig. 12]
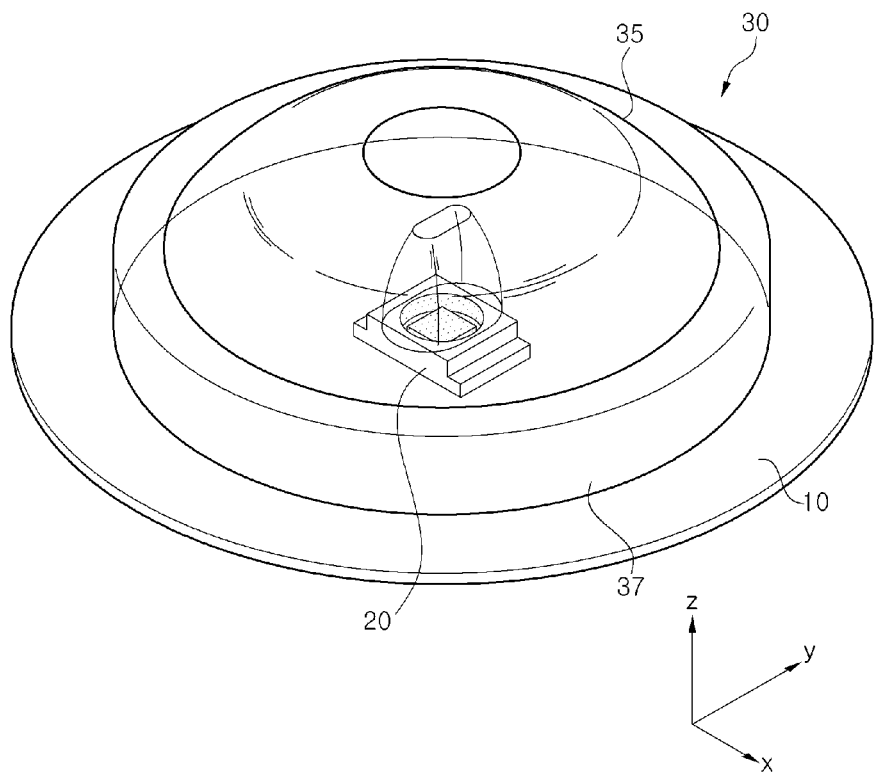

[Fig. 13 (a)]
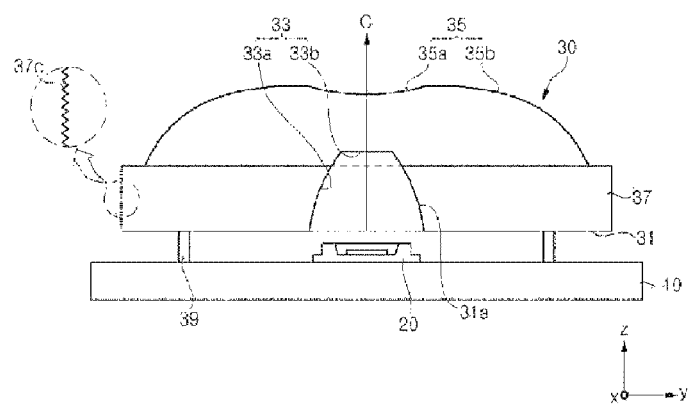
[Fig. 13 (b)]
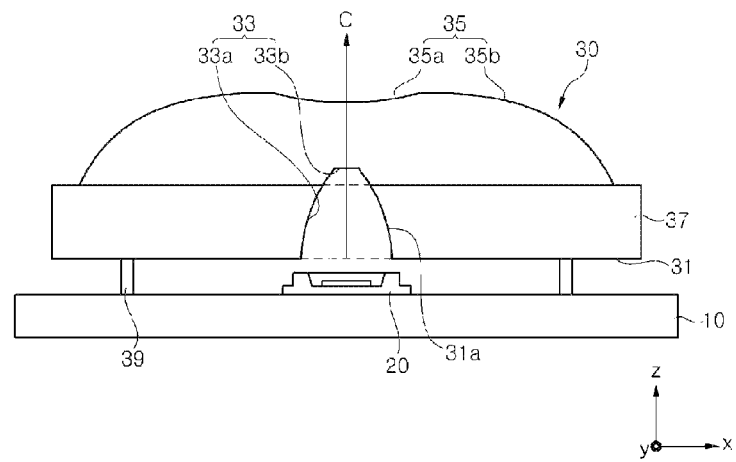

[Fig. 14]
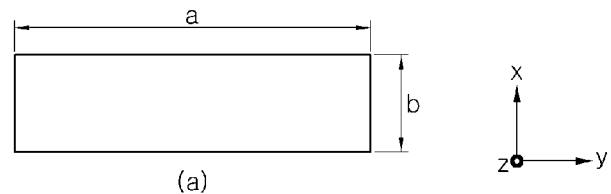
(a)
(b)
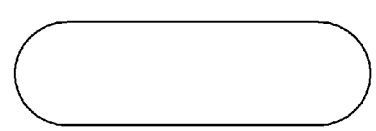
(c)
[Fig. 15 (a)]    [Fig. 15 (b)]
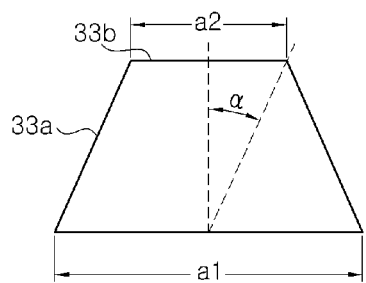    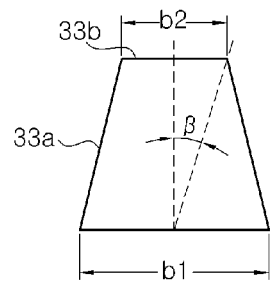
[Fig. 16 (a)]    [Fig. 16 (b)]
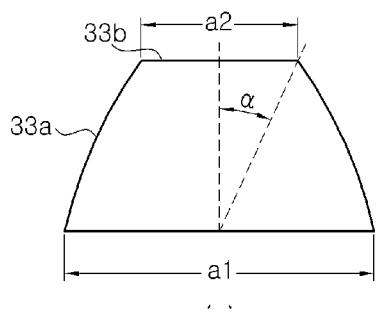    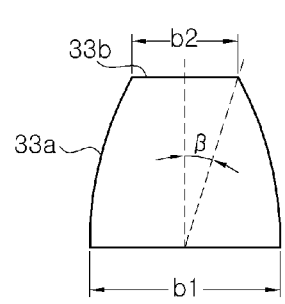

[Fig. 17]
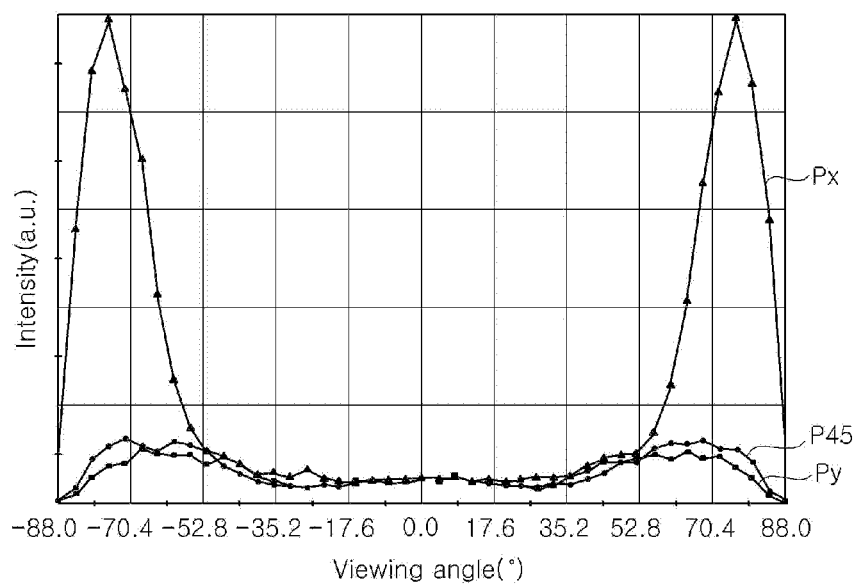

【Fig. 18 (a)】
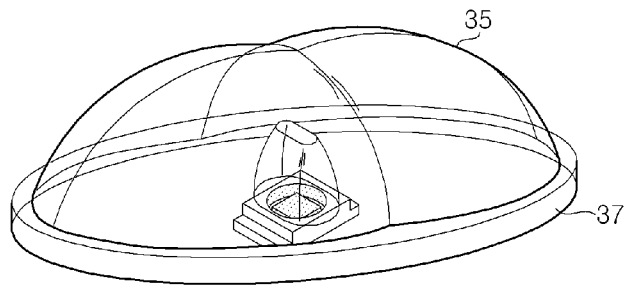
【Fig. 18 (b)】
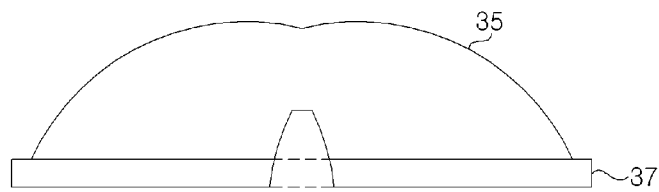
【Fig. 18 (c)】
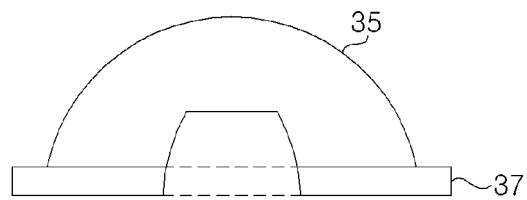
【Fig. 19】
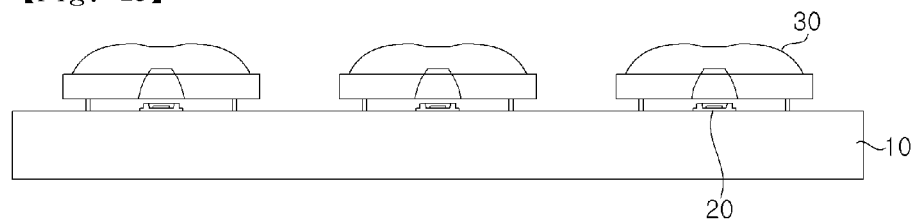

LIGHT EMITTING MODULE AND LENS

CROSS-REFERENCE TO RELATED APPLICATIONS

This application is a continuation of U.S. patent application Ser. No. 14/362,393, filed on Jun. 2, 2014, which is the National Stage of International Application No. PCT/KR2012/010314, filed on Nov. 30, 2012, and claims priority from and the benefit of Korean Patent Application No. 10-2011-0128375, filed on Dec. 2, 2011, and Korean Patent Application No. 10-2011-0141098, filed on Dec. 23, 2011, which are hereby incorporated by reference for all purposes as if fully set forth herein.

BACKGROUND

Field

The present invention relates to a light emitting module, and more particularly, to a light emitting module including a lens for use as a surface illumination or a backlight of a liquid crystal display.

Discussion of the Background

There are edge-type backlights and direct-type backlights for backlighting a liquid crystal display. As for the edge-type backlights, light emitting diodes (LEDs) are arranged on a side of a light guide plate, and light incident from a light source backlights a liquid crystal panel by using the light guide plate. The edge-type backlights can reduce the number of LEDs and does not require a high level of quality deviation among LEDs. Therefore, the edge-type backlights are cost-effective and are advantageous to development of low power consuming products. However, the edge-type backlights can hardly overcome a difference in contrast between an edge portion and a central portion of the liquid crystal display, and has a limitation in implementing high picture quality.

On the other hand, as for the direct-type backlights, a plurality of LEDs are arranged directly under a liquid crystal panel at constant intervals, and light from the LEDs backlights the liquid crystal panel. The direct-type backlights have advantages that can overcome a difference in contrast between an edge portion and a central portion of the liquid crystal panel and can implement high picture quality.

However, in the case of the direct-type backlights, if the respective LEDs cannot uniformly backlight a relatively large area, it is necessary to densely arrange a larger number of LEDs, resulting in an increase in power consumption. In addition, if the LEDs have quality deviation, the liquid crystal panel is non-uniformly backlighted, making it difficult to secure uniform quality of a screen.

In order to reduce the number of LEDs used, technique for dispersing light by arranging a lens in each LED may be used. However, even a slight change in alignment between the LED and the lens may cause a serious change in distribution of light emitted through the lens, making it more difficult to uniformly backlight the liquid crystal panel.

Also, as illustrated in FIG. 1, when a lens having a disk-shaped light orientation pattern LP is applied, a bright portion WP in which adjacent light beams cross each other and a dark portion BP in which light is rarely irradiated may be formed.

The bright portion WP can be controlled by reducing luminous flux travelling toward the bright portion WP, while adjusting brightness based on an viewing angle of the light orientation pattern LP. On the other hand, the dark portion BP can be controlled by increasing the size of the light orientation pattern LP or reducing a gap between the LEDs. However, if the luminous flux travelling toward the bright portion WP is reduced so as to remove the bright portion WP, the dark portion BP may further darken, and conversely, if the size of the light orientation pattern LP is increased or the gap between the LEDs is reduced so as to remove the dark portion BP, the bright portion WP becomes wider and brighter. In other words, it is difficult to remove both the bright portion WP and the dark portion BP.

SUMMARY

An aspect of the present invention is directed to a lens for dispersing light and a light emitting module including the same, and more particularly, to a light emitting module and a lens suitable for a surface light source or a direct-type backlight source.

Another aspect of the present invention is directed to a lens for dispersing light and a light emitting module including the same, and more particularly, to a lens and a light emitting module capable of increasing an alignment tolerance between an LED and a lens.

Another aspect of the present invention is directed to a light emitting module and a lens capable of emitting uniform light over a large area in a light source using a plurality of LEDs.

Another aspect of the present invention is directed to a lens and a light emitting module that are easy to fabricate.

According to an aspect of the present invention, a light emitting module includes a light emitting diode chip, and a lens dispersing luminous flux of light emitted from the light emitting diode chip. The lens includes: a lower surface having a concave portion on which light emitted from the light emitting diode chip is incident; and an upper surface from which the light incident on the concave portion is emitted. The upper surface includes a concave surface positioned in a central axis thereof. The concave portion of the lower surface includes at least one of a surface perpendicular to the central axis and a downwardly convex surface. At least one of the surface perpendicular to the central axis and the downwardly convex surface is positioned within a region narrower than an entrance region of the concave portion.

The upper surface and the concave portion of the lens may have a mirror surface symmetry with respect to a surface passing through the central axis. The upper surface and the concave portion of the lens may have a rotator shape with respect to the central axis.

The upper surface of the lens may include a convex surface continuously extending from the concave surface.

In some embodiments, light scattering patterns may be formed on at least one of the surface perpendicular to the central axis and the downwardly convex surface within the concave portion of the lower surface and on a surface positioned closer to the central axis than the at least one surface. A light scattering pattern may be formed with an uneven pattern, and may further disperse light emitted from the light emitting diode to the vicinity of the central axis.

A light scattering pattern may be formed on the concave surface of the upper surface.

In some embodiments, material layers having a refractive index different from the lens may be further formed on at least one of the surface perpendicular to the central axis and the downwardly convex surface within the concave portion of the lower surface and on a surface positioned closer to the central axis than the at least one surface.

A material layer having a refractive index different from the lens may be further formed on the concave surface of the upper surface.

At least one of the surface perpendicular to the central axis and the downwardly convex surface is limitedly positioned in a region narrower than a region surrounded by inflection lines where the concave surface and the convex surface of the upper surface meet each other. At least one of the surface perpendicular to the central axis and the downwardly convex surface is limitedly positioned in a region narrower than a light exit surface region of the light emitting device.

The lens may further include a flange connecting the upper surface and the lower surface, and at least one of the surface perpendicular to the central axis and the downwardly convex surface within the concave portion is positioned above the flange.

In some embodiments, the light emitting module may include a light emitting device, wherein the light emitting device includes: the light emitting diode chip; a housing in which the light emitting diode chip is mounted; and a wavelength conversion layer converting a wavelength of light emitted from the light emitting diode chip. The wavelength conversion layer may be spaced apart from the concave portion of the lens and positioned under the lens.

The light emitting module may further include a printed circuit board in which the light emitting device is mounted, and the lens may be placed on the printed circuit board. For example, the lens may have legs, and the legs of the lens may be placed on the printed circuit board.

Air gap may exist between the light emitting device and the concave portion. Therefore, the light incident on the concave portion may be primarily refracted from the surface of the concave portion.

According to another aspect of the present invention, a lens includes a light emitting diode chip, and a lens dispersing luminous flux of light emitted from the light emitting diode chip. The lens includes: a lower surface having a concave portion on which light emitted from the light emitting diode chip is incident; and an upper surface from which the light incident on the concave portion is emitted. An entrance region of the concave portion has a shape elongated in a single axis direction.

The entrance region of the concave portion may have various shapes. For example, the entrance region of the concave portion may have a rectangular shape, an oval shape, or a rectangular shape with rounded corners.

A cross-sectional shape of the concave portion along the single axis direction may be a trapezoid shape in which the concave portion is symmetrical with respect to a central axis and a lateral surface is a straight line, or a trapezoid shape in which the lateral surface is a curved line. Also, a cross-sectional shape of the concave portion along a direction perpendicular to the single axis direction may be a trapezoid shape in which the concave portion is symmetrical with respect to the central axis and a lateral surface is a straight line, or a trapezoid shape in which the lateral surface is a curved line.

The upper portion of the lens may have a rotational symmetry, but is not limited thereto. The upper portion of the lens may have a shape elongated in a direction perpendicular to the single axis direction. The upper surface may have a shape in which two hemispheres overlap each other.

In some embodiments, the upper surface may include a concave surface positioned in a central axis thereof. The concave portion of the lower surface may include at least one of a surface perpendicular to the central axis and a downwardly convex surface. At least one of the surface perpendicular to the central axis and the downwardly convex surface may be positioned in a region narrower than an entrance region of the concave portion.

The upper surface and the concave portion of the lens may have a mirror surface symmetry with respect to a surface passing through the central axis.

The upper surface of the lens may include a convex surface continuously extending from the concave surface.

In some embodiments, light scattering patterns may be formed on at least one of the surface perpendicular to the central axis and the downwardly convex surface within the concave portion of the lower surface and on a surface positioned closer to the central axis than the at least one surface. A light scattering pattern may be formed with an uneven pattern, and may further disperse light emitted from the light emitting diode to the vicinity of the central axis.

A light scattering pattern may be formed on the concave surface of the upper surface.

The lens may further include a flange connecting the upper surface and the lower surface. At least one of the surface perpendicular to the central axis and the downwardly convex surface within the concave portion may be positioned above the flange.

In some embodiments, the light emitting module may further include a light emitting device, wherein the light emitting device includes: the light emitting diode chip; a housing in which the light emitting diode chip is mounted; and a wavelength conversion layer converting a wavelength of light emitted from the light emitting diode chip. The wavelength conversion layer may be spaced apart from the concave portion of the lens and positioned under the lens.

The light emitting module may further include a printed circuit board in which the light emitting device is mounted, and the lens may be placed on the printed circuit board. For example, the lens may include legs, and the legs may be placed on the printed circuit board.

Air gap may exist between the light emitting device and the concave portion. Therefore, the light incident on the concave portion may be primarily refracted from the surface of the concave portion.

According to embodiments of the present invention, since primary refraction occurs in a concave portion of a lens and secondary refraction occurs in an upper surface of the lens, the lens can extensively disperse light. In addition, since an upper end of the concave portion of the lens is shaped to include a flat surface or a convex surface, instead of a concave surface, an alignment tolerance between an LED chip or a light emitting device and the lens can be increased. Furthermore, since a change in light orientation distribution characteristics according to the shape of the upper end of the concave portion of the lens can be alleviated, a lens fabrication process margin is increased, making it easy to fabricate the lens.

Also, since an entrance region of the concave portion of the lens, on which light is incident, has an elongated shape, light can be extensively dispersed in a minor-axis direction, thereby implementing an elongated light orientation pattern. Thus, by arranging a plurality of LED chips and arranging the lens on each of the LED chips, luminous flux can be uniformly distributed over a large area by the elongated light patterns, thereby implementing a uniform surface light source.

BRIEF DESCRIPTION OF THE DRAWINGS

The accompanying drawings, which are included to provide a further understanding of the invention and are incor- FIG. 1 is a view for describing a light pattern of a surface light source according to the related art.

FIG. 2 is a schematic cross-sectional view for describing a light emitting module according to an embodiment of the present invention.

FIG. 3 is a schematic perspective view for describing a light emitting device.

FIGS. 4 (a) to (d) are cross-sectional views for describing various modifications of a lens.

FIGS. 5 (a) and (b) are lens cross-sectional views for describing a light emitting module according to another embodiment of the present invention.

FIG. 6 is a cross-sectional view for describing dimensions of a light emitting module used in a simulation.

FIGS. 7 (a) to (c) are graphs for describing shapes of the lens of FIG. 6.

FIG. 8 is a view illustrating a light beam travelling direction of the lens of FIG. 6.

FIGS. 9 (a) and (b) are graphs showing illuminance distributions. Specifically, FIG. 9A shows an illuminance distribution of a light emitting device, and FIG. 9B shows an illuminance distribution of a light emitting module using a lens.

FIGS. 10 (a) and (b) are graphs showing light orientation distributions. Specifically, FIG. 10A shows a light orientation distribution of a light emitting device, and FIG. 10B shows a light orientation distribution of a light emitting module using a lens.

FIG. 11 is a view for describing a light pattern of a surface light source according to other embodiments of the present invention.

FIG. 12 is a schematic perspective view of a light emitting module according to an embodiment of the present invention.

FIGS. 13(a) and (b) are cross-sectional views of the light emitting module of FIG. 12, taken along x-axis and y-axis.

FIG. 14 is plan views for describing various shapes of a concave portion of a lens.

FIGS. 15(a) and (b) and 16(a) and (b) are cross-sectional views for describing various shapes of the concave portion of the lens.

FIG. 17 is a graph for describing a light orientation distribution of the light emitting module according to the present invention.

FIGS. 18 (a) to (c) are a perspective view and cross-sectional views for describing a lens according to another embodiment of the present invention.

FIG. 19 is a cross-sectional view for describing a light emitting module including a plurality of light emitting devices according to an embodiment of the present invention.

DETAILED DESCRIPTION OF THE
ILLUSTRATED EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like elements throughout this disclosure.

FIG. 2 is a schematic cross-sectional view for describing a light emitting module according to an embodiment of the present invention, and FIG. 3 is a perspective view for describing a light emitting device used in the light emitting module.

Referring to FIG. 2, the light emitting module includes a printed circuit board (PCB) 10, a light emitting device 20, and a lens 30. Although the PCB 10 is partially illustrated, a plurality of light emitting devices 20 may be variously arranged in a matrix form, a honeycomb form, or the like, on the single PCB 10.

The PCB 10 includes conductive land patterns, which are to be bonded to terminals of the light emitting device 20, on an upper surface thereof. Also, the PCB 10 may include a reflective film on the upper surface thereof. The PCB 10 may be a metal-core PCB (MCPCB) based on a metal having excellent thermal conductivity. Also, the PCB 120 may be based on an insulating substrate material such as FR4. Although not illustrated, a heat sink may be disposed under the PCB 10 in order to dissipate heat generated from the light emitting device 20.

As illustrated in FIG. 3, the light emitting device 20 includes a housing 21, an LED chip 23 mounted on the housing 21, and a wavelength conversion layer 25 covering the LED chip 23. The light emitting device 20 further includes lead terminals (not illustrated) supported by the housing 21.

The housing 21 constituting a package body may be formed by injection-molding a plastic resin, such as PA or PPA. In this case, the housing 21 may be molded in a state of supporting the lead terminals through the injection molding process, and may have a cavity 21a allowing the LED chip 23 to be mounted therein. The cavity 21a defines a light exit region of the light emitting device 20.

The lead terminals are disposed to be spaced apart from each other within the housing 21, and extend to the outside of the housing 21, such that the lead terminals are bonded to the land patterns on the PCB 10.

The LED chip 23 is mounted on the bottom of the cavity 21a and electrically connected to the lead terminals. The LED chip 23 may be a gallium nitride-based LED that emits ultraviolet light or blue light.

Meanwhile, the wavelength conversion layer 25 covers the LED chip 23. In an embodiment, after the LED chip 23 is mounted, the wavelength conversion layer 25 may be formed by filling the cavity 21a with a molding resin containing a phosphor. In this case, the upper surface of the wavelength conversion layer 25, which fills the cavity 21a of the housing 21, may be substantially flat or convex. Also, a molding resin having a lens shape may be further formed on the wavelength conversion layer 25.

In another embodiment, the LED chip 23 with a conformal phosphor coating layer formed thereon may be mounted on the housing 21. In other words, a conformal phosphor coating layer may be applied on the LED chip 23, and the LED chip 23 including the conformal phosphor coating layer may be mounted on the housing 21. The LED chip 23 including the conformal phosphor coating layer may be molded by a transparent resin. In addition, the molding resin may have a lens shape, and thus, the molding resin may serve as a primary lens.

The wavelength conversion layer 25 converts a wavelength of light emitted from the LED chip 23 to implement mixed color light, for example, white light.

The light emitting device 20 is designed to have a light orientation distribution of a mirror surface symmetry, and in particular, the light emitting device 20 may be designed to have a light orientation distribution of a rotational symmetry. In this case, an axis of the light emitting device 20 directed toward the center of the light orientation distribution is defined as an optical axis L. That is, the light emitting device 20 is designed to have a light orientation distribution that is bilaterally symmetrical with respect to the optical axis L. In general, the cavity 21a of the housing 21 may be formed to have a mirror surface symmetry, and the optical axis L may be defined as a straight line passing through the center of the cavity 21a.

Referring back to FIG. 2, the lens 30 includes a lower surface 31 and an upper surface 35, and may further include a flange 37 and legs 39. The lower surface 31 includes a concave portion 31a, and the upper surface 35 includes a concave surface 35a and a convex surface 35b.

The lower surface 31 is formed with a substantially disk-shaped flat surface, and the concave portion 31a is positioned in a central portion of the lower surface 31. The lower surface 31 may not be flat and may be formed with various uneven patterns.

Meanwhile, the inner surface of the concave portion 31a has a lateral surface 33a and an upper end surface 33b. The upper end surface 33b is perpendicular to a central axis C, and the lateral surface 33a continuously extends from the upper end surface 33b to the entrance of the concave portion 31a. When the central axis C is aligned to be consistent with the optical axis L of the light emitting device 20, the central axis C is defined as a central axis of the lens 30 as the center of a light orientation distribution emitted from the lens 30.

The concave portion 31a may be shaped such that the width is gradually narrowed upward from the entrance thereof. That is, the lateral surface 33a becomes closer to the central axis C as it goes from the entrance to the upper end surface 33b. Accordingly, the upper end surface 33b region may be formed to be relatively smaller than the entrance. The lateral surface 33a may have a relatively gentle slope in the vicinity of the upper end surface 33b.

The upper end surface 33b region is restricted to a region narrower than the entrance region of the concave portion 31a. In addition, the upper end surface 33b region may be restricted to a region narrower than a region surrounded by an inflection line formed by the concave surface 35a and the convex surface 35b of the upper surface 35. Moreover, the upper end surface 33b region may be restricted to be positioned in a region narrower than the cavity 21a region, i.e., a light exit region, of the light emitting device 20.

When the optical axis L of the light emitting device 20 and the central axis C of the lens 30 are misaligned, the upper end surface 33b region reduces a change in the light orientation distribution emitted through the upper surface 35 of the lens 30. Thus, the upper end surface 33b region may be minimized in consideration of an alignment error between the light emitting device 20 and the lens 30.

Meanwhile, the upper surface 35 of the lens 30 includes the concave surface 35a and the convex surface 35b continuously extending from the concave surface 35a with reference to the central axis C. A line where the concave surface 35a and the convex surface 35b meet each other is the inflection line. The concave surface 35a refracts light emitted in the vicinity of the central axis C of the lens 30 at a relatively large angle to disperse light in the vicinity of the central axis C. Also, the convex surface 35b increases an amount of light emitted outward from the central axis C.

The upper surface 35 and the concave portion 31a are symmetrical with respect to the central axis C. For example, the upper surface 35 and the concave portion 31a have a mirror surface symmetry with respect to a surface passing through the central axis C, or may have a rotator shape with respect to the central axis C. Also, the concave portion 31a and the upper surface 35 may have various shapes according to a required light orientation distribution.

Meanwhile, the flange 37 connects the upper surface 35 and the lower surface 31 and limits an outer size of the lens 30. Uneven patterns may be formed on a lateral surface of the flange 37 and the lower surface 31. Meanwhile, the legs 39 of the lens 30 are connected to the PCB 10 to support the lower surface 31 such that the lower surface 31 is separated from the PCB 10. For example, the connection may be performed such that a front end of each of the legs 39 is attached to the PCB 10 by an adhesive, or each of the legs 39 is inserted into a hole formed in the PCB 10.

The lens 30 is disposed to be spaced apart from the light emitting device 20. Therefore, air gap is formed within the concave portion 31a. The housing 21 of the light emitting device 20 may be positioned under the lower surface 31, and the wavelength conversion layer 25 of the light emitting device 20 may be positioned under the lower surface 31 and distant from the concave portion 31a. Accordingly, it is possible to prevent the loss of light travelling within the concave portion 31a due to the absorption into the housing 21 or the wavelength conversion layer 25.

According to the present embodiment, since the surface perpendicular to the central axis C is formed within the concave portion 31a, a change in the light orientation distribution emitted from the lens 30 can be reduced even when an alignment error occurs between the light emitting device 20 and the lens 30. In addition, since a relatively sharp apex is not formed in the concave portion 31a, the lens can be easily fabricated.

FIG. 4 is cross-sectional views for describing various modifications of the lens. Various modifications of the concave portion 31a in FIG. 2 will be described.

In FIG. 4A, a portion of the upper end surface 33b perpendicular to the central axis C described above with reference to FIG. 2 forms a downwardly convex surface in the vicinity of the central axis C. Light incident to the vicinity of the central axis C can be primarily controlled by the convex surface.

FIG. 4B is similar to FIG. 4A but different in that the surface of the upper end surface 33b in FIG. 4A, which is perpendicular to the central axis C, is formed to be upwardly concave. Since the upper end surface 33b mixedly has the upwardly concave surface and the downwardly convex surface, a change in the light orientation distribution due to the alignment error between the light emitting device 20 and the lens 30 can be reduced.

In FIG. 4C, a portion of the upper end surface 33b perpendicular to the central axis C described above with reference to FIG. 2 forms an upwardly concave surface in the vicinity of the central axis C. Light incident to the vicinity of the central axis C can be further dispersed by the concave surface.

FIG. 4D is similar to FIG. 4C but different in that the surface of the upper end surface 33b in FIG. 4(a), which is perpendicular to the central axis C, is formed to be downwardly convex. Since the upper end surface 33b mixedly has the upwardly concave surface and the downwardly convex surface, a change in the light orientation distribution due to the alignment error between the light emitting device 20 and the lens 30 can be reduced.

FIG. 5 is lens cross-sectional views for describing a light emitting module according to another embodiment of the present invention.

Referring to FIG. 5A, a light scattering pattern 33c may be formed on the upper end surface 33b. The light scattering pattern 33c may be formed with an uneven pattern. In addition, a light scattering pattern 35c may also be formed on the concave surface 35a. The light scattering pattern 35c may also be formed with an uneven pattern.

In general, a relatively large amount of luminous flux is concentrated on the vicinity of the central axis C of the lens 30. In addition, in the embodiments of the present invention, since the upper end surface 33b is perpendicular to the central axis C, luminous flux may be further concentrated on the vicinity of the central axis C. Thus, by forming the light scattering patterns 33c and 35c on the upper end surface 33b and/or the concave surface 35a, luminous flux in the vicinity of the central axis C may be distributed.

Referring to FIG. 5B, a material layer 39a having a refractive index different from that of the lens 30 may be positioned on the upper end surface 33b. The material layer 39a may have a refractive index greater than that of the lens, and thus, it may change a path of light incident on the upper end surface 33b.

In addition, a material layer 39b having a refractive index from that of the lens 30 may be positioned on the concave surface 35a. The material layer 39b may have a refractive index greater than that of the lens, and thus, a refraction angle of light emitted through the concave surface 35a may become larger.

The light scattering patterns 33c and 35c in FIG. 5A and the material layers 39a and 39b in FIG. 5B may also be applied to various lenses illustrated in FIG. 4.

FIG. 6 is a cross-sectional view illustrating dimensions of the light emitting module used in the simulation. Reference numerals of FIGS. 2 and 3 will be used herein.

The cavity 21a of the light emitting device 20 has a diameter of 2.1 mm and a height of 0.6 mm. The wavelength conversion layer 25 fills the cavity 21a and has a flat surface. Meanwhile, a distance d between the light emitting device 20 and the lower surface 31 of the lens 30 is 0.18 mm, and the light emitting device 20 and the lens 30 are disposed such that the optical axis L and the central axis C are aligned.

Meanwhile, a height H of the lens 30 is 4.7 mm, and a width W1 of the upper surface 35 is 15 mm. A width W2 of the concave surface 35a is 4.3 mm. A width w1 of the entrance of the concave portion 31a positioned in the lower surface 31 is 2.3 mm, a width w2 of the upper end surface 33b is 0.5 mm, and a height h of the concave portion 31a is 1.8 mm.

FIG. 7 is graphs for describing shapes of the lens of FIG. 6. FIG. 7A is a cross-sectional view for describing a reference point P, a distance R, an incident angle $\theta 1$, and an exit angle $\theta 5$, and FIG. 7B shows a change in the distance R according to the incident angle $\theta 1$. FIG. 7C shows a change in $\theta 5/\theta 1$ according to the incident angle $\theta 1$. Meanwhile, FIG. 8 illustrates light beam travelling directions when light beams are incident from the reference point P to the lens 30 at 3° intervals.

Referring to FIG. 7A, the reference point P indicates a light exit point of the light emitting device 20 positioned on the optical axis L. The reference point P may be appropriately determined to be positioned on the outer surface of the wavelength conversion layer 25 in order to exclude influence of light scattering, or the like, by phosphors in the light emitting device 20.

Meanwhile, $\theta 1$ is an angle at which light is incident from the reference point P to the lens 30, namely, an incident angle, and $\theta 5$ is an angle at which light is emitted from the upper surface 35 of the lens 30, namely, an exit angle. Meanwhile, R is a distance from the reference point P to the inner surface of the concave portion 31a.

Referring to FIG. 7B, since the upper end surface 33b of the concave portion 31a is perpendicular to the central axis C, R is slightly increased as $\theta 1$ is increased. The enlarged graph illustrated in the graph of FIG. 7B shows the increase of R. Meanwhile, as $\theta 1$ is increased in the lateral surface 33a of the concave portion 31a, R is reduced and is slightly increased in the vicinity of the entrance of the concave portion 31a.

Referring to FIG. 7C, as $\theta 1$ is increased, $(\theta 5/\theta 1)$ is sharply increased in the vicinity of the concave surface 35a and relatively gently reduced in the vicinity of the convex surface 35b. In the present embodiment, as illustrated in FIG. 8, luminous fluxes of light emitted in the vicinity where the concave surface 35a and the convex surface 35b are adjacent may be overlapped with each other. Namely, a refraction angle of light, which is included in the light incident from the reference point P and emitted toward the concave surface 35a, may be greater than that of light emitted toward the convex surface 35b in the vicinity of the inflection line. Thus, concentration of luminous flux in the vicinity of the central axis C can be lessened by controlling the shape of the concave surface 35a and the convex surface 35b while allowing the upper end surface 33b of the concave portion 31a to have a flat shape.

FIG. 9 is graphs showing illuminance distributions based on the light emitting device and the lens of FIG. 6. Specifically, FIG. 9A shows an illuminance distribution of the light emitting device, and FIG. 9B shows an illuminance distribution of the light emitting module using a lens. The illuminance distribution was represented by a magnitude of a luminous flux density of light incident on a screen spaced apart from the light emitting device by 25 mm.

As illustrated in FIG. 9A, the light emitting device 20 has an illuminance distribution that is bilaterally symmetrical with respect to the optical axis C, in which the luminous flux density is very high in the center and sharply reduced toward a peripheral portion. When the lens 30 is applied to the light emitting device 20, a generally uniform luminous density can be obtained within a radius of 40 mm as illustrated in FIG. 9B.

FIG. 10 is graphs showing light orientation distributions based on the light emitting device and the lens of FIG. 6. Specifically, FIG. 10A shows a light orientation distribution of a light emitting device, and FIG. 10B shows a light orientation distribution of a light emitting module using a lens. The light orientation distribution indicates luminous intensity according to a viewing angle at a point spaced apart by 5 m from the reference point P, and orientation distribution in mutually perpendicular directions are indicated to overlap in the single graph.

As illustrated in FIG. 10A, light emitted from the light emitting device 20 has a tendency that luminous intensity is high at 0°, i.e., at the center, and the luminous intensity is reduced as the viewing angle is increased. In comparison, when a lens is applied, as illustrated in FIG. 10B, luminous intensity is relatively low in the viewing angle 0° and relatively high around 70°.

Thus, the light orientation distribution of the light emitting device, which is strong in the center, may be changed by applying the lens 30, to thereby uniformly backlight a relatively large area.

The light emitting module and the lens according to embodiments of the present invention may also be applied to a surface illumination apparatus, without being limited to backlighting of a liquid crystal display.

FIG. 11 is a view for describing a light pattern of a surface light source according to another embodiment of the present invention.

Referring to FIG. 11, according to other embodiments of the present invention, light orientation pattern Lp emitted through a lens has an elongated shape. Thus, a light pattern in which a bright portion Wp is elongated may be implemented by arranging the light orientation patterns Lp at constant intervals.

Since the elongated light orientation patterns Lp are arranged, the formation of the dark portion $B_P$ as in the related art can be prevented or minimized, and thus, the luminous flux distribution may be adjusted to remove the bright portion Wp without consideration of the dark portion $B_P$, thereby easily implementing a uniform surface light source.

FIG. 12 is a schematic perspective view for describing a light emitting module according to an embodiment of the present invention. FIG. 13 is cross-sectional views of the light emitting module of FIG. 12. Specifically, FIG. 13A is a cross-sectional view taken in a direction of a major axis (y), and FIG. 13B is a cross-sectional view taken in a direction of a minor axis (x).

Referring to FIGS. 12 and 13, the light emitting module includes a PCB 10, a light emitting device 20, and a lens 30. Although the PCB 10 is partially illustrated, a plurality of light emitting devices 20 may be variously arranged in a straight-line or matrix form on the single PCB 10.

Since the PCB 10 is the same as described above with reference to FIG. 2, a detailed description thereof will be omitted. Since the light emitting device 20 is also the same as described above with reference to FIG. 3, a detailed description thereof will be omitted. As described above with reference to FIG. 3, the wavelength conversion layer 25 may be formed to cover the LED chip 23 by filling the cavity 21a with a molding resin containing phosphors, or the LED chip with a conformal phosphor coating layer formed thereon may be mounted on the housing 21.

It has been described that the light emitting device 20 including the LED chip 23 and the housing 21 is mounted on the PCB 10, but the LED chip 23 may be directly mounted on the PCB 20 and the wavelength conversion layer 25 may cover the LED chip 23 on the PCB 10.

Referring back to FIGS. 13A and 13B, the lens 30 may include a lower surface 31 and an upper surface 35, and also includes a flange 37 and legs 39. The lower surface 31 includes the concave portion 31a, and the upper surface 35 includes the concave surface 35a and the convex surface 35b.

The lower surface 31 is formed with a substantially disk-shaped flat surface, and the concave portion 31a is positioned in a central portion of the lower surface 31. The lower surface 31 may not be flat and may be formed with various uneven patterns.

The concave portion 31a is a portion in which light emitted from the light emitting device 20 is incident on the lens 30. The LED chip 23 is positioned under the central portion of the concave portion 31a. The entrance region of the concave portion 31a has an elongated shape. In the drawing, the entrance region of the concave portion 31a is elongated in the y-axis direction. In this case, the x-axis direction is a minor-axis direction and the y-axis direction is a major-axis direction.

The entrance region of the concave portion 31a may have various shapes. For example, as illustrated in FIG. 14, the entrance region of the concave portion 31a may have (a) a rectangular shape, (b) an oval shape, (c) a rectangular shape with rounded corners, and so on. Here, a width of the entrance region of the concave portion 31a in the major-axis direction is indicated as 'a' and a width thereof in the minor-axis direction is indicated as 'b'.

Meanwhile, the width of the concave portion 31a is narrowed as it goes from the entrance region to the interior of the concave portion 31a. As illustrated in FIGS. 15A and 15B, a cross-sectional shape of the concave portion 31a may be a trapezoid shape having bilateral symmetry. FIG. 15A shows a cross section of the concave portion 31a taken in the major-axis (y) direction, and FIG. 15B shows a cross section of the concave portion 31a taken in the minor-axis (x) direction.

In FIG. 15A, a length of the bottom side of the trapezoid is indicated as a1, a length of the top side thereof is indicated as a2, and an angle of a line passing through the edge of the top side from the center of the bottom side with respect to the central axis is indicated as α. Here, a2 is smaller than a1. Meanwhile, in FIG. 15B, a length of the bottom side of the trapezoid is indicated as b1, a length of the top side thereof is indicated as b2, and an angle of a line passing through the edge of the top side from the center of the bottom side with respect to the central axis is indicated as β. Here, b2 is smaller than b1. In this case, a2 is greater than b2, and thus, it is preferable that α is greater than β.

The case where the cross-sectional shape of the concave portion 31a is the trapezoid shape in which the lateral surface is a straight line has been described with reference to FIGS. 15A and 15B, but as illustrated in FIGS. 16A and 16B, the cross-sectional shape of the concave portion 31a may also be a trapezoid shape in which the lateral surface is a curved line.

By forming the entrance region of the concave portion 31a in an elongated shape, an elongated light orientation pattern Lp as illustrated in FIG. 11 may be implemented.

Referring back to FIGS. 13A and 13B, the inner surface of the concave portion 31a may have the lateral surface 33a and the upper end surface 33b. The upper end surface 33b is perpendicular to the central axis C, and the lateral surface 33a continuously extends from the upper end surface 33b to the entrance of the concave portion 31a. When the central axis C is aligned to be consistent with the optical axis L of the light emitting device 20, the central axis C is defined as the center of a light orientation distribution emitted from the lens 30.

As described above, the concave portion 31a may be shaped such that the width is gradually narrowed upward from the entrance thereof. That is, the lateral surface 33a becomes closer to the central axis C as it goes from the entrance to the upper end surface 33b. Accordingly, the upper end surface 33b region may be formed to be relatively smaller than the entrance. The lateral surface 33a may have a relatively gentle slope in the vicinity of the upper end surface 33b.

The upper end surface 33b region is restricted to a region narrower than the entrance region of the concave portion 31a. In particular, the width of the upper end surface 33b in the minor-axis (x) direction may be restricted to a region narrower than a region surrounded by an inflection line formed by the concave surface 35a and the convex surface 35b of the upper surface 35. Moreover, the width of the upper end surface 33b in the minor-axis (x) direction may be restricted to be positioned in a region narrower than the cavity 21a region, i.e., a light exit region, of the light emitting device 20.

When the optical axis L of the light emitting device 20 and the central axis C of the lens 30 are misaligned, the upper end surface 33b region reduces a change in the light orientation distribution emitted through the upper surface 35 of the lens 30. Thus, the upper end surface 33b region may be minimized in consideration of an alignment error between the light emitting device 20 and the lens 30.

Meanwhile, the upper surface 35 of the lens 30 includes the concave surface 35a and the convex surface 35b continued from the concave surface 35a with reference to the central axis C. A line where the concave surface 35a and the convex surface 35b meet each other is an inflection line. The concave surface 35a refracts light emitted in the vicinity of the central axis C of the lens 30 at a relatively large angle to disperse light in the vicinity of the central axis C. Also, the convex surface 35b increases an amount of light emitted outward from the central axis C.

The upper surface 35 and the concave portion 31a have a mirror surface symmetry with respect to the surface passing through the central axis C along the x axis and the y axis. Also, the upper surface 35 may have a rotator shape with respect to the central axis C. Also, the concave portion 31a and the upper surface 35 may have various shapes according to a required light orientation distribution.

Meanwhile, the flange 37 connects the upper surface 35 and the lower surface 31 and limits an outer size of the lens 30. Uneven patterns 37c may be formed on a lateral surface of the flange 37 and the lower surface 31. Meanwhile, the legs 39 of the lens 30 are connected to the PCB 10 to support the lower surface 31 such that the lower surface 31 is separated from the PCB 10. For example, the connection may be performed such that a front end of each of the legs 39 is attached to the PCB 10 by an adhesive, or each of the legs 39 is inserted into a hole formed in the PCB 10.

The lens 30 is disposed to be spaced apart from the light emitting device 20. Therefore, air gap is formed within the concave portion 31a. The housing 21 of the light emitting device 20 may be positioned under the lower surface 31, and the wavelength conversion layer 25 of the light emitting device 20 may be positioned under the lower surface 31 and distant from the concave portion 31a. Accordingly, it is possible to prevent the loss of light travelling within the concave portion 31a due to the absorption into the housing 21 or the wavelength conversion layer 25.

According to the present embodiment, since the entrance region of the concave portion 31a is formed to have an elongated shape, the light orientation pattern emitted through the lens 30 may have a shape elongated in the minor-axis (x) direction. Also, since the surface perpendicular to the central axis C is formed within the concave portion 31a, a change in the light orientation distribution emitted from the lens 30 can be reduced even when an alignment error occurs between the light emitting device 20 and the lens 30. In addition, since the upper end surface 33b of the concave portion 31a is formed as a flat surface, a relatively sharp apex is not formed in the concave portion 31a. Therefore, the lens can be easily fabricated.

The concave portion 31a having a trapezoid shape has been described, but the shape of the concave portion 31a may be variously modified rather than being limited thereto. For example, as described above with reference to FIGS. 4A and 4B, the shape of the concave portion 31a of FIG. 13 may be variously deformed to primarily control light incident to the vicinity of the central axis C to disperse light or alleviate a change in a light orientation distribution due to the alignment error between the light emitting device and the lens.

FIG. 17 is a graph showing an example of a light orientation distribution of a light emitting module using a lens according to an embodiment of the present invention. A light orientation distribution Px in the x-axis direction, a light orientation distribution Py in the y-axis direction, and a light orientation distribution P45 in a 45-degree direction were simulated by using the light emitting device 20 having the same illuminance distribution in the minor-axis (x) direction and the major-axis (y) direction and the lens 30 described above with reference to FIGS. 12 and 13. The light orientation distributions indicate luminous intensities according to viewing angles at a point distant from the light emitting device 20 by 5 m, and orientation distributions in the respective direction are shown to overlap in the single graph.

As illustrated in FIG. 17, the light orientation distribution Px in the minor-axis (x) direction has a relatively low luminous intensity at the viewing angle of 0° and a relatively high luminous intensity in the vicinity of 70°. This means that light is extensively distributed. In comparison, the light orientation distribution P45 in the 45-degree direction with respect to the light orientation distribution Py in the major-axis (y) direction and the x axis has a luminous intensity that is not greatly changed according to the viewing angle. Thus, it can be seen that light is not extensively distributed.

Therefore, it can be seen that a light orientation pattern elongated in the x-axis direction can be obtained by the light emitting module.

FIG. 18 is views for describing a lens according to another embodiment of the present invention. Specifically, FIG. 18 is a perspective view and FIGS. 18B and 18C are cross-sectional-views taken in mutually perpendicular directions. In the following description, the same reference numerals as those of FIG. 13 will be used.

Referring to FIGS. 18A and 18B, the lens 30 according to the present embodiment is similar to that described above with reference to FIGS. 12 and 13, but has a difference in the shape of the upper surface 35. That is, the upper surface 35 of the lens 30 has a shape elongated in the direction perpendicular to the major-axis (y) direction of the concave portion 31a, namely, in the minor-axis (x) direction of the concave portion 31a. In particular, the upper surface 35 of the lens 30 may have a shape in which two hemispheres overlap each other. A symmetrical surface of the two hemispheres is consistent with a surface passing through the center of the concave portion 31a in the major-axis direction of the concave portion 31a.

Since the upper surface 35 of the lens 30 has the elongated shape in the minor-axis direction of the concave portion 31a, light can be dispersed by the shape of the upper surface 35 of the lens 30 together with the shape of the concave portion 31a, light orientation pattern emitted from the lens 30 may be made to have a further elongated shape.

Meanwhile, in the foregoing embodiments, a light scattering pattern (not illustrated) may be formed in the upper end surface 33b of the concave portion 31a. The light scattering pattern may be formed with an uneven pattern. In addition, a light scattering pattern, for example, an uneven pattern, may also be formed on the concave surface 35a of the upper surface 35. In general, a relatively large amount of luminous flux is concentrated on the vicinity of the central axis C of the lens 30. In addition, in the embodiments of the present invention, since the upper end surface 33b is substantially perpendicular to the central axis C, luminous flux may be further concentrated on the vicinity of the central axis C. Thus, by forming the light scattering patterns on the upper end surface 33b and/or the concave surface 35a, luminous flux in the vicinity of the central axis C may be dispersed.

In addition, in order to disperse luminous flux in the vicinity of the central axis C, a material layer (not illustrated) having a refractive index different from that of the lens 30 may be positioned on the upper end surface 33b. The material layer 39a may have a refractive index greater than that of the lens, and thus, it may change a path of light incident on the upper end surface 33b. In addition, a material layer 39b having a refractive index from that of the lens 30 may be positioned on the concave surface 35a. The material layer 39b may have a refractive index greater than that of the lens, and thus, a refraction angle of light emitted through the concave surface 35a may become larger.

FIG. 19 is a cross-sectional view for describing a light emitting module having a plurality of light emitting devices according to an embodiment of the present invention.

Referring to FIG. 19, the light emitting module is similar to the light emitting module described above with reference to FIGS. 12 and 13, but has a difference in that a plurality of light emitting devices 20 are disposed on the PCB 10. The lens 30 described above with reference to FIGS. 12 and 13 is disposed on each of the light emitting devices 20.

The light emitting device 20 may be arranged in a row on the PCB 20, or may be arranged in various shapes, such as a matrix shape or a honeycomb shape. Through the arrangement of the light emitting devices 20, the light patterns as illustrated in FIG. 11 can be implemented. In particular, since the elongated light pattern Lp is implemented by the lens 30, the generation of the dark portion Bp as in the related art can be eliminated or reduced. Therefore, the surface light source for illumination or the surface light source for backlighting, which exhibits uniform luminous intensity over a large area can be provided.

While the present invention has been described with respect to the specific embodiments, it will be apparent to those skilled in the art that various changes and modifications may be made without departing from the spirit and scope of the invention as defined in the following claims.

What is claimed is:

1. A lens, comprising:
an upper surface comprising a curved surface changing a curvature in a direction extending away from a central axis of the lens;
a lower surface comprising a concave portion disposed on the central axis of the lens; and
wherein the concave portion of the lower surface comprises:
an entrance disposed on a lower region of the concave portion and configured to receive light emitted from a light emitting diode chip;
an upper end surface disposed on the upper region of the concave portion; and
a lateral surface extending from the upper end surface to the entrance,
wherein the concave portion comprises a width that narrows in a direction extending away from the entrance,
wherein the closer a point of the lateral surface is to the upper end surface, the closer the point is to the central axis,
wherein the upper end surface of the concave portion is nonplanar,
wherein the nonplanar upper end surface comprises a concave surface disposed on the central axis and a convex surface surrounding the concave surface,
wherein the convex surface of the upper end surface is connected to the lateral surface,
wherein both the concave surface and the convex surface of the upper end surface have a curvature in a cross-section parallel to the central axis of the lens,
wherein a location of a lowest point of the convex surface is lower than that of a point at which the convex surface of the upper end surface and the lateral surface are connected, and
wherein the lens is configured to disperse luminous flux of light emitted from the light emitting diode chip through the entrance in a viewing angle wider than that of light emitted from the light emitting diode chip.

2. The lens of claim 1, wherein a light scattering pattern is disposed on the upper end surface of the concave portion.

3. The lens of claim 1, further comprising a flange connected to the lower surface,
wherein both the concave surface and the convex surface of the upper end surface of the concave portion are disposed between an upper end of the flange and the upper surface of the lens, and
wherein the flange comprises an uneven pattern disposed on a lateral surface thereof.

4. A light-emitting module comprising:
a light emitting diode chip; and
a lens configured to disperse luminous flux of light emitted from the light-emitting diode chip in a viewing angle wider than that of light emitted from the light emitting diode chip,
wherein the lens comprises:
an upper surface comprising a curved portion having a changing curvature in a direction extending away a central axis of the lens;
a lower surface comprising a concave portion disposed on the central axis of the lens; and
wherein the concave portion of the lower surface comprises:
an entrance disposed on a lower region of the concave portion and configured to receive light emitted from the light-emitting diode chip;
an upper end surface disposed on the upper region of the concave portion; and
a lateral surface extending from the upper end surface to the entrance,
wherein the concave portion comprises a width that narrows in a direction extending away from the entrance,
wherein the closer a point of the lateral surface is to the upper end surface, the closer the point is to the central axis,
wherein the upper end surface of the concave portion is nonplanar,
wherein the nonplanar upper end surface comprises a concave surface disposed on the central axis and a convex surface surrounding the concave surface,
wherein the convex surface of the upper end surface is connected to the lateral surface,
wherein a location of a lowest point of the convex surface is lower than that of a point at which the convex surface of the upper end surface and the lateral surface are connected, and
wherein both the concave surface and the convex surface of the upper end surface have a curvature in a cross-section parallel to the central axis.

5. The light-emitting module of claim 4, wherein a light-scattering pattern is disposed on the upper end surface of the concave portion.

6. The light-emitting module of claim 4, wherein:
- the lens further comprises a flange connected to the lower surface,
- both the concave surface and the convex surface of the upper end surface of the concave portion are disposed between an upper end of the flange and the upper surface of the lens, and
- the flange comprises an uneven pattern disposed on a lateral surface thereof.

7. The light-emitting module of claim 4, further comprising a light-emitting device,
- wherein the light emitting device comprises:
  - the light-emitting diode chip;
  - a housing in which the light-emitting diode chip is disposed; and
  - a wavelength conversion layer configured to convert light emitted from the light-emitting diode chip.

8. The light-emitting module of claim 7, wherein the wavelength conversion layer is:
- disposed between the light-emitting diode chip and the lens; and
- spaced apart from the concave portion of the lower surface of the lens.

9. The light-emitting module of claim 7, further comprising a printed circuit board on which the light-emitting device is disposed.

10. The light-emitting module of claim 7, further comprising an air gap disposed between the light emitting device and the concave portion of the lower surface of the lens.

* * * * *